(12) United States Patent
Hu et al.

(10) Patent No.: US 11,587,499 B2
(45) Date of Patent: Feb. 21, 2023

(54) DISPLAY PANEL INCLUDING CHIP ON FILM, METHOD FOR DRIVING THE SAME AND DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Ye Hu, Beijing (CN); Kai Diao, Beijing (CN); Qingna Hou, Beijing (CN); Hongzhou Xie, Beijing (CN); Shangtao Zheng, Beijing (CN); Renhui Yu, Beijing (CN); Wen Zha, Beijing (CN); Xin Chen, Beijing (CN); Meizhen Chen, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/280,810

(22) PCT Filed: May 15, 2020

(86) PCT No.: PCT/CN2020/090563
§ 371 (c)(1),
(2) Date: Mar. 26, 2021

(87) PCT Pub. No.: WO2021/227031
PCT Pub. Date: Nov. 18, 2021

(65) Prior Publication Data
US 2022/0122523 A1  Apr. 21, 2022

(51) Int. Cl.
*G09G 3/32* (2016.01)
*H01L 27/12* (2006.01)
*H01L 27/32* (2006.01)

(52) U.S. Cl.
CPC ............. *G09G 3/32* (2013.01); *H01L 27/124* (2013.01); *G09G 2300/0408* (2013.01);
(Continued)

(58) Field of Classification Search
CPC ............. G09G 3/32; G09G 2300/0408; G09G 2300/0809; G09G 2310/0267;
(Continued)

(56) References Cited

U.S. PATENT DOCUMENTS

2008/0024714 A1    1/2008  Park
2014/0152938 A1*   6/2014  Lee ...................... G09G 3/3648
                                                        438/30

(Continued)

FOREIGN PATENT DOCUMENTS

CN    105206242 A    12/2015
CN    108241240 A    7/2018
(Continued)

OTHER PUBLICATIONS

European Search Report dated Jun. 10, 2022, Application No./Patent No. 20894942-1210/3996140 PCT/CN2020090563, 12 Pages.

*Primary Examiner* — Adam J Snyder
(74) *Attorney, Agent, or Firm* — Brooks Kushman P.C.

(57) ABSTRACT

The present disclosure provides a display panel, a method for driving the display panel and a display device. The display panel includes a display region and a non-display region. The non-display region includes a first bonding region, and further includes first connection lines connected to a plurality of gate lines respectively and second connection lines connected to a plurality of data lines respectively.

(Continued)

The display panel further includes at least one chip on film, the chip on film includes a second bonding region, a first region, and a second region between the second bonding region and the first region. A scanning driving integrated circuitry connected to the second bonding region via first wirings and a data driving integrated circuitry connected to the second bonding region via second wirings are bonded in the first region. The first wirings and the second wirings are arranged at different layers in the second region.

14 Claims, 7 Drawing Sheets

(52) U.S. Cl.
CPC ............... *G09G 2300/0426* (2013.01); *G09G 2300/0809* (2013.01); *G09G 2310/0267* (2013.01); *G09G 2310/0275* (2013.01); *G09G 2310/0278* (2013.01); *G09G 2310/0281* (2013.01); *G09G 2330/06* (2013.01); *H01L 27/3276* (2013.01)

(58) Field of Classification Search
CPC ....... G09G 2310/0275; G09G 2330/06; G09G 2300/0426; G09G 2310/0278; G09G 2310/0281; H01L 27/124; H01L 27/3276
See application file for complete search history.

(56) References Cited

U.S. PATENT DOCUMENTS

| | | | |
|---|---|---|---|
| 2014/0239317 A1* | 8/2014 | Bang | H05K 3/361 438/28 |
| 2016/0027398 A1* | 1/2016 | Kim | G09G 3/2092 345/212 |
| 2017/0061857 A1 | 3/2017 | Lee et al. | |
| 2017/0269416 A1 | 9/2017 | Miao et al. | |
| 2018/0321765 A1 | 11/2018 | Chiang et al. | |
| 2019/0103069 A1 | 4/2019 | Choi | |
| 2019/0164877 A1 | 5/2019 | Cho et al. | |
| 2019/0244906 A1* | 8/2019 | Min | H01L 25/0655 |
| 2019/0244974 A1 | 8/2019 | Chen | |
| 2020/0348573 A1* | 11/2020 | Shin | G09G 3/20 |
| 2021/0056882 A1* | 2/2021 | Lee | G09G 3/20 |

FOREIGN PATENT DOCUMENTS

| | | |
|---|---|---|
| CN | 109584814 A | 4/2019 |
| CN | 109860142 A | 6/2019 |
| CN | 110109297 A | 8/2019 |
| CN | 110910766 A | 3/2020 |
| JP | 2014228575 A | 12/2014 |

* cited by examiner

DISPLAY PANEL INCLUDING CHIP ON FILM, METHOD FOR DRIVING THE SAME AND DISPLAY DEVICE

CROSS-REFERENCE TO RELATED APPLICATION

This application is the U.S. national phase of PCT Application No. PCT/CN2020/090563 filed on May 15, 2020, which is incorporated herein by reference in its entirety.

TECHNICAL FIELD

The present disclosure relates to the field of display technology, in particular to a display panel, a method for driving the display panel, and a display device.

BACKGROUND

Along with the continuous advancement of science and technology, people's pursuit of well appearance has become increasingly intense, and a narrow-bezel or even bezel-free display device has attracted more and more attention.

In the related art, a driving integrated circuitry of the display device is intensively arranged on a side of a display region, so as to provide a narrow bezel on the other three sides of the display region. However, a width of a bezel on the side where the driving integrated circuitry is located increases, so it is impossible to provide the narrow-bezel display device as a whole or the bezel-free display device.

SUMMARY

An object of the present disclosure is to provide a display panel, a method for driving the display panel, and a display device, so as to solve the above-mentioned problem.

In one aspect, the present disclosure provides in some embodiments a display panel, including a display region and a non-display region. The display region includes a plurality of gate lines extending in a first direction and a plurality of data lines extending in a second direction, and the plurality of gate lines intersect the plurality of data lines to define a plurality of pixel regions. The non-display region includes at least one first bonding region located on one side of the display region, and further includes first connection lines connected to the plurality of gate lines respectively and second connection lines connected to the plurality of data lines respectively. At least a part of each first connection line and at least a part of each second connection line are used for bonding connection, and the part of each first connection line and the part of each second connection line used for bonding connection are located in the first bonding region. The display panel further includes at least one chip on film, the chip on film includes a second bonding region bonded to the first bonding region, and further includes a first region and a second region located between the second bonding region and the first region. A scanning driving integrated circuitry and a data driving integrated circuitry are bonded in the first region, the scanning driving integrated circuitry is connected to the second bonding region via first wirings, and the data driving integrated circuitry is connected to the second bonding region via second wirings. The first wirings and the second wirings are arranged at different layers in the second region.

In a possible embodiment of the present disclosure, a plurality of bonding electrodes is arranged in the second bonding region and includes first bonding electrodes and second bonding electrodes, the first bonding electrodes are connected to the first wirings respectively, the second bonding electrodes are connected to the second wirings respectively, and the first bonding electrodes and the second bonding electrodes are located on a same side of the chip on film.

In a possible embodiment of the present disclosure, the plurality of bonding electrodes are located on the same side of the chip on film as the scanning driving integrated circuitry and the data driving integrated circuitry. A third wiring is located on the same side of the chip on film as the scanning driving integrated circuitry and the data driving integrated circuitry. The chip on film further includes a third region located between the first region and the second region and a fourth region located between the second bonding region and the second region, the third region is provided with a first via hole, and the fourth region is provided with a second via hole. A fourth wiring includes a first segment connected to the second bonding region, a second segment connected to a target driving integrated circuitry and a third segment connected to the second segment through the first via hole and connected to the first segment through the second via hole, and the second segment and the first segment are located on the same side of the chip on film as the third wiring. The third wiring is the first wiring, the fourth wiring is the second wiring, and the target driving integrated circuitry is the data driving integrated circuitry; or the third wiring is the second wiring, the fourth wiring is the first wiring, and the target driving integrated circuitry is the scanning driving integrated circuitry.

In a possible embodiment of the present disclosure, the scanning driving integrated circuitry and the data driving integrated circuitry are located on a same side of the chip on film, and the plurality of bonding electrodes is located on the other side of the chip on film. The chip on film further includes a third region located between the first region and the second region and a fourth region located between the second bonding region and the second region, the third region is provided with a first via hole, and the fourth region is provided with a second via hole. A third wiring includes a first segment connecting a first driving integrated circuitry and the second via hole, and a second segment connecting the first segment and the second bonding region through the second via hole. A fourth wiring includes a third segment connecting the second bonding region and the first via hole and a fourth segment connecting the third segment and a second driving integrated circuitry through the first via hole, and the first segment and the third segment are arranged at two sides of the chip on film respectively. The third wiring is the first wiring, the fourth wiring is the second wiring, the first driving integrated circuitry is the scanning driving integrated circuitry, and the second driving integrated circuitry is the data driving integrated circuitry; or the third wiring is the second wiring, the fourth wiring is the first wiring, the first driving integrated circuitry is the data driving integrated circuitry, and the second driving integrated circuitry is the scanning driving integrated circuitry.

In a possible embodiment of the present disclosure, the plurality of bonding electrodes and a first driving integrated circuitry are located on the same side of the chip on film, and a second driving integrated circuitry is located on the other side of the chip on film. A third wiring is located on the same side of the chip on film as the plurality of bonding electrodes and the first driving integrated circuitry. The chip on film further includes a third region located between the first region and the second region and a fourth region located between the second bonding region and the second region, and the fourth region is provided with a third via hole. A fourth wiring includes a first segment connecting the second driving integrated circuitry and the third via hole and a second segment connecting the first segment and the second bonding region through the third via hole. The third wiring is the first wiring, the fourth wiring is the second wiring, the first driving integrated circuitry is the scanning driving integrated circuitry, and the second driving integrated circuitry is the data driving integrated circuitry; or the third wiring is the second wiring, the fourth wiring is the first wiring, the first driving integrated circuitry is the data driving integrated circuitry, and the second driving integrated circuitry is the scanning driving integrated circuitry.

In a possible embodiment of the present disclosure, the second bonding region includes a plurality of repetition units, and each repetition unit includes a first low level signal electrode, at least one first bonding electrode and at least one second bonding electrode.

In a possible embodiment of the present disclosure, each repetition unit includes P first bonding electrodes and Q second bonding electrodes.

In a possible embodiment of the present disclosure, the chip on film further includes first low level signal lines connected to the first low level signal electrodes respectively. The first low level signal line is arranged at a same layer as the first wiring in the second region and electrically connected to the scanning driving integrated circuitry; or the first low level signal line is arranged at a same layer as the second wiring in the second region and electrically connected to the data driving integrated circuitry.

In a possible embodiment of the present disclosure, the first bonding region includes a plurality of second low level signal electrodes, Z signal transmission lines are arranged between two adjacent second low level signal electrodes, and the Z signal transmission lines include the first connection lines and/or the second connection lines.

In a possible embodiment of the present disclosure, the Z signal transmission lines include X first connection lines and Y second connection lines.

In a possible embodiment of the present disclosure, two scanning driving integrated circuitries respectively arranged on two adjacent chip on films are connected to each other via a scanning input/output signal line, and two data driving integrated circuitries respectively arranged on two adjacent chip on films are connected to each other via a data input/output signal line.

In another aspect, the present disclosure provides in some embodiments a display device, including the above-mentioned display panel.

In a possible embodiment of the present disclosure, the display device further includes a power management integrated circuitry and a timing sequence control circuitry. The power management integrated circuitry is configured to apply an operation voltage to the timing sequence control circuitry. The timing sequence control circuitry is configured to apply a timing sequence signal to the chip on film. The power management integrated circuitry is further configured to apply a digital voltage signal and an analog voltage signal to the chip on film.

In yet another aspect, the present disclosure provides in some embodiments a method for driving the above-mentioned display panel, including: applying, by the scanning driving integrated circuitry on the at least one chip on film, a gate scanning signal to each gate line through the corresponding first wiring, the second bonding region, the first bonding region and the corresponding first connection line sequentially in a time division manner; and in the case that the gate scanning signal is applied to one gate line, applying, by the data driving integrated circuitry on the at least one chip on film, a data signal to each data line through the corresponding second wiring, the second bonding region, the first bonding region and the corresponding second connection line sequentially.

In a possible embodiment of the present disclosure, two scanning driving integrated circuitries respectively arranged on two adjacent chip on films are connected to each other via a scanning input/output signal line, and two data driving integrated circuitries respectively arranged on two adjacent chip on films are connected to each other via a data input/output signal line. The applying, by the scanning driving integrated circuitry on the at least one chip on film, the gate scanning signal to each gate line through the corresponding first wiring, the second bonding region, the first bonding region and the corresponding first connection line sequentially in a time division manner includes: after a gate scanning signal has been applied by a scanning driving circuitry on a first chip on film to a first gate line through the corresponding first wiring, the second bonding region, the first bonding region and the corresponding first connection line sequentially in a time division manner, transmitting, by the first chip on film, a scanning on signal to a second chip on film through the scanning input/output signal line, the first chip on film and the second chip on film being two adjacent chip on films, the first gate line being a gate line electrically connected to the scanning driving circuitry in the first chip on film; and after the second chip on film has received the scanning on signal, applying, by a scanning driving circuitry in the second chip on film, a gate scanning signal to a second gate line through the corresponding first wiring, the second bonding region, the first bonding region and the corresponding first connection line sequentially in a time division manner, the second gate line being a gate line electrically connected to the scanning driving circuitry in the second chip on film.

In a possible embodiment of the present disclosure, the applying, by the data driving integrated circuitry on the at least one chip on film, the data signal to each data line through the corresponding second wiring, the second bonding region, the first bonding region and the corresponding second connection line sequentially includes: after the data signal has been applied by a data driving circuitry on a first chip on film to a first data line through the corresponding second wiring, the second bonding region, the first bonding region and the corresponding second connection line sequentially, transmitting, by the first chip on film, a data on signal to a second chip on film through the data input/output signal line, the first data line being a data line electrically connected to the data driving circuitry in the first chip on film; and after the second chip on film has received the data on signal, applying, by a data driving circuitry in the second chip on film, a data signal to a second data line through the corresponding second wiring, the second bonding region, the first bonding region and the corresponding second connection line sequentially in a time division manner, the second data line being a data line electrically connected to the data driving circuitry in the second chip on film.

DETAILED DESCRIPTION

Figure 1:
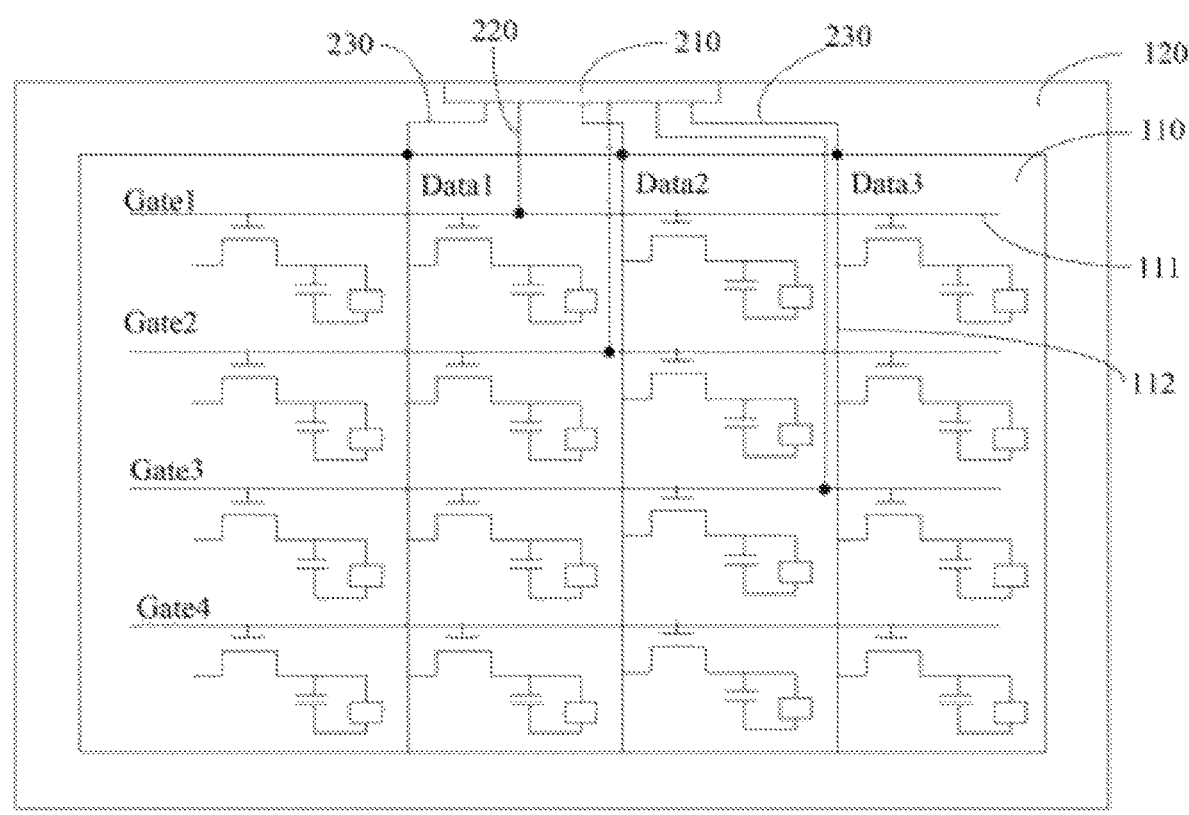
FIG. 1 is a schematic view showing a display substrate in a display panel according to an embodiment of the present disclosure.
Figure 2:
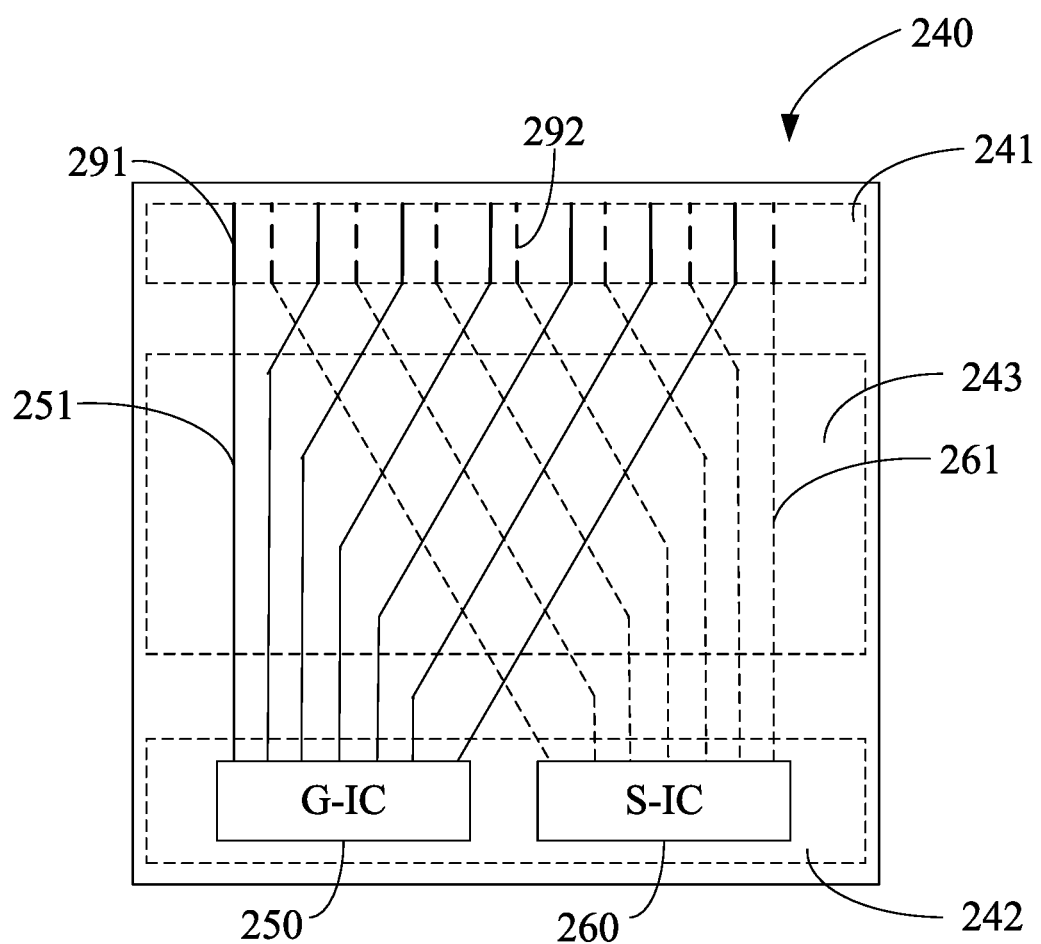
FIG. 2 is a schematic view showing a chip on film in the display panel according to an embodiment of the present disclosure.

The present disclosure provides in some embodiments a display panel, which as shown in FIG. 1 and FIG. 2, includes a display region 110 and a non-display region 120. The display region 110 includes a plurality of gate lines 111 extending in a first direction and a plurality of data lines 112 extending in a second direction, and the plurality of gate lines 111 intersects the plurality of data lines 112 to define a plurality of pixel regions. The non-display region 120 includes at least one first bonding region 210 located on one side of the display region 110, and further includes first connection lines 220 connected to the plurality of gate lines 111 respectively and second connection lines 230 connected to the plurality of data lines 112 respectively. At least a part of each first connection line 220 and at least a part of each second connection line 230 are used for bonding connection, and the part of each first connection line 220 and the part of each second connection line 230 used for bonding connection are located in the first bonding region 210. The display panel further includes at least one chip on film 240. The chip on film 240 includes a second bonding region 241 bonded to the first bonding region 210, and further includes a first region 242 and a second region 243 located between the second bonding region 241 and the first region 242. A scanning driving integrated circuitry 250 and a data driving integrated circuitry 260 are bonded in the first region 242, the scanning driving integrated circuitry 250 is connected to the second bonding region 241 via a first wiring 251, and the data driving integrated circuitry 260 is connected to the second bonding region 241 via a second wiring 261. The first wiring 251 and the second wiring 261 are arranged at different layers in the second region 243.

In the embodiments of the present disclosure, the scanning driving integrated circuitry and the data driving integrated circuitry may be bonded on the same chip on film and bonded to the first bonding region of the non-display region to replace a gate driver on array (GOA) unit having a relatively large area, so as to provide a display device with a narrow bezel as a whole without affecting the normal scanning of the gate line. Hence, according to the embodiments of the present disclosure, it is able to provide the display device with a narrow bezel design as a whole.

As shown in FIG. 1, the non-display region 120 may be located at a periphery of the display region 110, and surround the display region 110.

The first direction may be a row direction of the display panel, and the second direction may be a column direction of the display panel. Of course, the first direction and the second direction may also be any other directions crossing each other, which will not be particularly defined herein.

Each pixel region may be provided with a thin film transistor (TFT) and a pixel electrode, a source electrode of the TFT may be connected to the data line, a drain electrode of the TFT may be connected to the pixel electrode, and a gate electrode may be connected to the gate line.

The non-display region 120 may include at least one first bonding region 210 located on a same side of the display region 110. The non-display region 120 may further include the first connection line 220 for connecting the first bonding region 210 and the corresponding gate line 111 and the second connection line 230 for connecting the first bonding region 210 and the corresponding data line 112. The first connection line 220 and the second connection line 230 may each include a part bonded in the first bonding region 210. In addition, the first connection line 220 may further include a part connected to the corresponding gate line 111 in the display region 110 as an on-screen wiring.

The second bonding region 241 on the chip on film (COF) 240 may be bonded to the first bonding region 210 in the non-display region 120, so as to transmit an electric signal from the chip on film 240 to the display substrate.

The scanning driving integrated circuitry 250 and the data driving integrated circuitry 260 may be bonded in the first region 242 of the chip on film 240. The scanning driving integrated circuitry 250 may be used to generate a scanning signal. The scanning signal may be transmitted to the second bonding region 241 through the first wiring 251, then transmitted to the first bonding region 210, and then transmitted to the gate line through the corresponding first connection line 220, so as to enable the source electrode of the TFT to be electrically connected to the drain electrode of the TFT in the pixel region. The data driving integrated circuitry 260 may be used to generate a data signal. The data signal may be transmitted to the second bonding region 241 through the second wiring 261, then transmitted to the first bonding region 210, and then transmitted to the data line through the corresponding second connection line 230, so as to charge the pixel electrode connected to the drain electrode of the TFT through the source electrode of the TFT, thereby to enable each light-emitting element in the display region 110 to emit light and enable the display device to display an image.

The first wiring 251 and the second wiring 261 may be arranged at different layers in the second region 243, so as to reduce or even eliminate signal crosstalk generated between the scanning signal on the first wiring 251 and the data signal on the second wiring 261, thereby to improve the signal transmission quality. In addition, it is able to further reduce a wiring space of the chip on film, thereby to reduce a size of the chip on film.

The chip on film may be folded to a back surface of the display panel, so the chip on film itself does not occupy a space in the non-display region of the display panel, as long as the chip on film is connected to the first bonding region in the non-display region of the display panel. In addition, because the scanning driving integrated circuitry and the data driving integrated circuitry are arranged on the chip on film simultaneously, the bonding region may be arranged on only one side of the display panel, so as to reduce an area of the non-display region, and enable a width of a widest bezel among four bezels in the display region to be smaller than 1.5 mm, thereby to provide the display device with an ultra-narrow bezel.

Further, a plurality of bonding electrodes may be arranged in the second bonding region 241, and the bonding electrodes may include first bonding electrodes 291 and second bonding electrodes 292. The first bonding electrodes 291 may be connected to the first wirings 251 respectively, and the second bonding electrodes 292 may be connected to the second wirings 261 respectively. The first bonding electrodes 291 and the second bonding electrodes 292 may be located at a same side of the chip on film 240.

In the embodiment of the present disclosure, the first bonding electrode 291 may receive the scanning signal applied by the scanning driving integrated circuitry 250 through the corresponding first wiring 251, and transmit the scanning signal to the first bonding region 210. The second bonding electrode 292 may receive the data signal applied by the data driving integrated circuitry 260 through the corresponding second wiring 261 and transmit the data signal to the first bonding region 210.

In order to facilitate the transmission of the scanning signal and the data signal to the first bonding region 210, the first bonding electrode 291 and the second bonding electrode 292 may be arranged on a side of the chip on film 240 facing the first bonding region 210.

Figure 3:
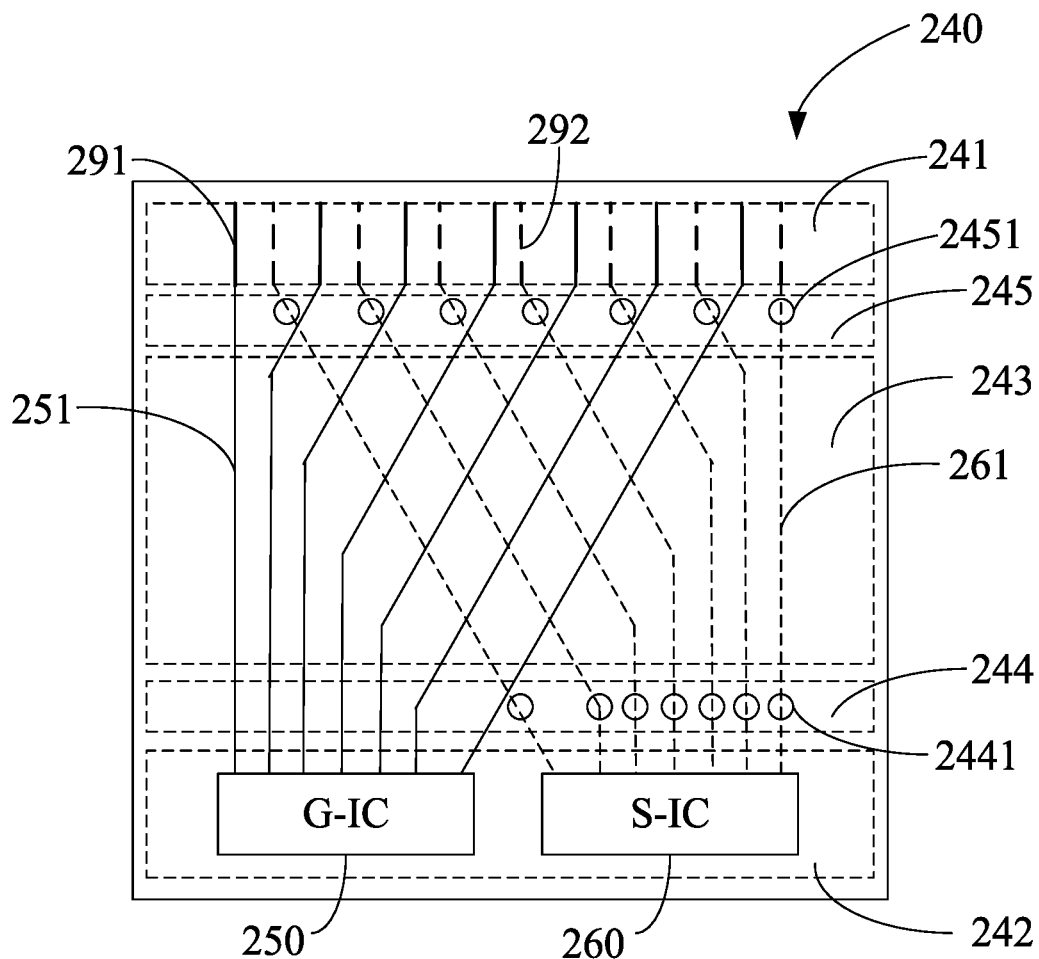
FIG. 3 is another view showing the chip on film in the display panel according to an embodiment of the present disclosure.
Figure 4:
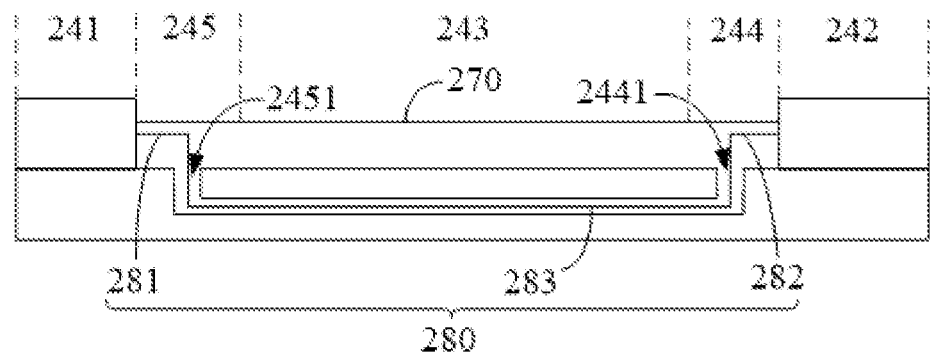
FIG. 4 is a schematic view showing wirings corresponding to FIG. 3.

In a possible embodiment of the present disclosure, as shown in FIG. 3 and FIG. 4, the plurality of bonding electrodes may be located on the same side of the chip on film 240 as the scanning driving integrated circuitry 250 and the data driving integrated circuitry 260. A third wiring 270 may be located on the same side of the chip on film as the scanning driving integrated circuitry 250 and the data driving integrated circuitry 260. The chip on film 240 may further include a third region 244 located between the first region 242 and the second region 243 and a fourth region 245 located between the second bonding region 241 and the second region 243, the third region 244 may be provided with a first via hole 2441, and the fourth region 245 may be provided with a second via hole 2451. A fourth wiring 280 may include a first segment 281 connected to the second bonding region 241, a second segment 282 connected to a target driving integrated circuitry and a third segment 283 connected to the second segment 282 through the first via hole 2441 and connected to the first segment 281 through the second via hole 2451, and the second segment 282 and the first segment 281 may be located on the same side of the chip on film as the third wiring 270. The third wiring 270 may be the first wiring 251, the fourth wiring 280 may be the second wiring 261, and the target driving integrated circuitry may be the data driving integrated circuitry 260; or the third wiring 270 may be the second wiring 261, the fourth wiring 280 may be the first wiring 251, and the target driving integrated circuitry may be the scanning driving integrated circuitry 250.

In the embodiment of the present disclosure, one of the first wiring 251 and the second wiring 261 may be arranged on the same side as the bonding electrodes, and a part of the other one of the first wiring 251 and the second wiring 261 located in the second region 243 may be arranged on a different side from the bonding electrodes.

To be specific, in the case that the third wiring 270 is the first wiring 251, the fourth wiring 280 is the second wiring 261, and the target driving integrated circuitry is the data driving integrated circuitry 260, the first wiring 251 may be located on the same side of the chip on film as the scanning driving integrated circuitry 250 and the data driving integrated circuitry 260, the second wiring 261 may include a first segment connected to the second bonding region 241, a second segment connected to the data driving integrated circuitry and a third segment connected to the second segment through the first via hole 2441 and connected to the first segment through the second via hole 2451, and the second segment and the first segment may be located on the same side of the chip on film as the first wiring 251.

In the case that the third wiring 270 is the second wiring 261, the fourth wiring 280 is the first wiring 251, and the target driving integrated circuitry is the scanning driving integrated circuitry 250, the second wiring 261 may be located on the same side of the chip on film as the scanning driving integrated circuitry 250 and the data driving integrated circuitry 260. The first wiring 251 may include a first segment connected to the second bonding region 241, a second segment connected to the scanning driving integrated circuitry and a third segment connected to the second segment through the first via hole 2441 and connected to the first segment through the second via hole 2451, and the second segment and the third segment may be located on the same side of the chip on film as the second wiring 261.

Figure 5:
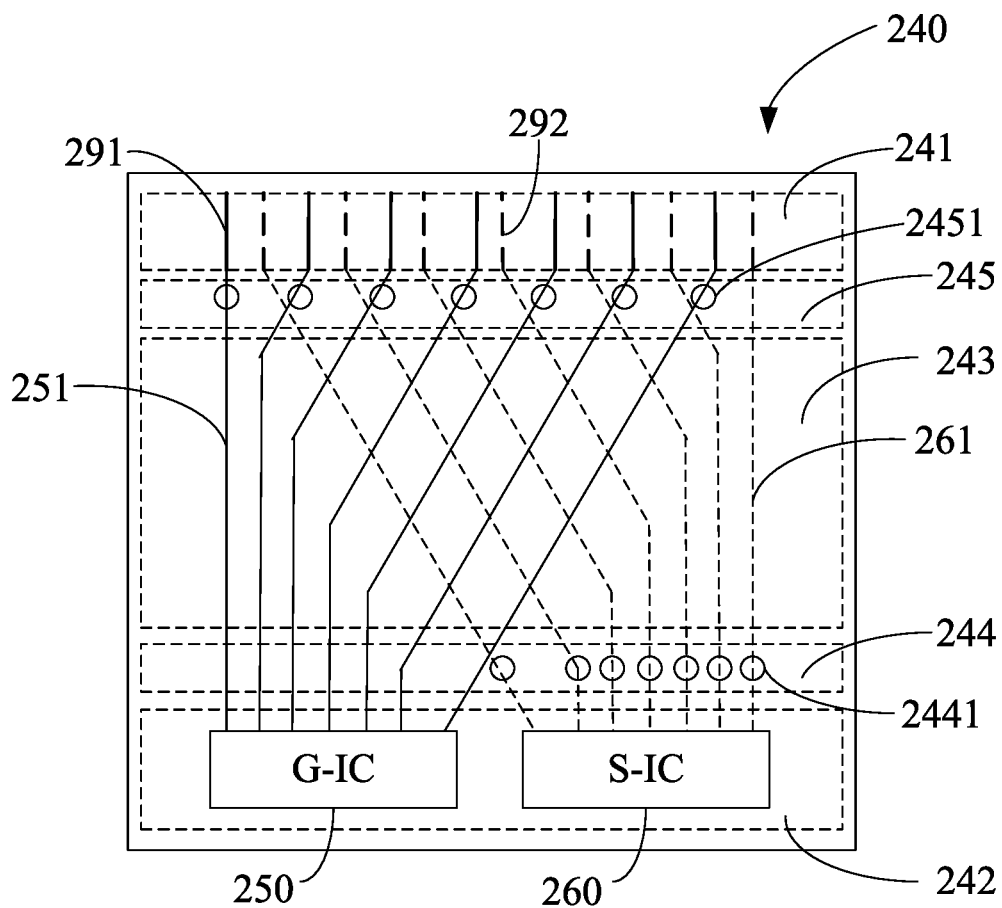
FIG. 5 is yet another schematic view showing the chip on film in the display panel according to an embodiment of the present disclosure.
Figure 6:
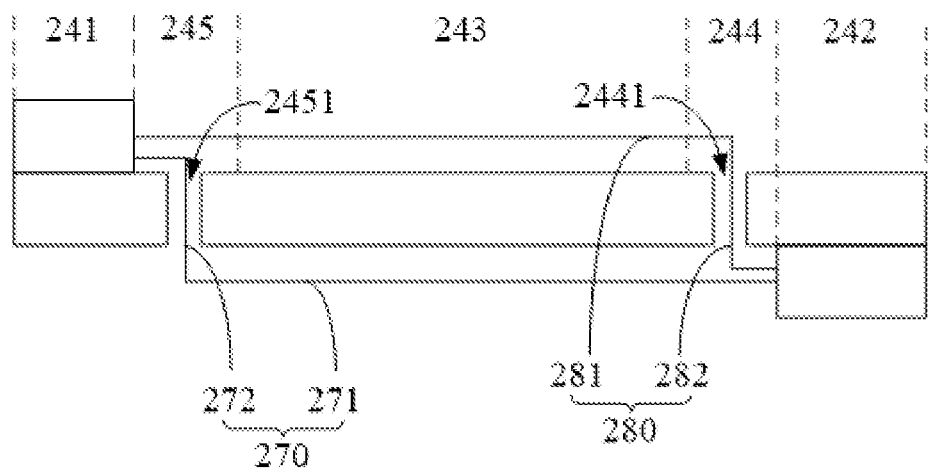
FIG. 6 is a schematic view showing wirings corresponding to FIG. 5.

In another possible embodiment of the present disclosure, as shown in FIG. 5 and FIG. 6, the scanning driving integrated circuitry 250 and the data driving integrated circuitry 260 may be located on a same side of the chip on film 240, and the plurality of bonding electrodes may be located on the other side of the chip on film 240. The chip on film 240 may further include a third region 244 located between the first region 242 and the second region 243 and a fourth region 245 located between the second bonding region 241 and the second region 243, the third region 244 may be provided with a first via hole 2441, and the fourth region 245 may be provided with a second via hole 2451. A third wiring 270 may include a first segment 271 connecting a first driving integrated circuitry and the second via hole 2451, and a second segment 272 connecting the first segment 271 and the second bonding region 241 through the second via hole 2451. A fourth wiring 280 may include a third segment 281 connecting the second bonding region 241 and the first via hole 2441, and a fourth segment 282 connecting the third segment 281 and a second driving integrated circuitry through the first via hole 2441, and the first segment 271 and the third segment 281 may be respectively located on two sides of the chip on film 240. The third wiring 270 may be the first wiring 251, the fourth wiring 280 may be the second wiring 261, the first driving integrated circuitry may be the scanning driving integrated circuitry 250, and the second driving integrated circuitry may be the data driving integrated circuitry 260; or the third wiring 270 may be the second wiring 261, the fourth wiring 280 may be the first wiring 251, the first driving integrated circuitry may be the data driving integrated circuitry 260, and the second driving integrated circuitry may be the scanning driving integrated circuitry 250.

In the embodiment of the present disclosure, one of the first wiring 251 and the second wiring 261 may be connected to the second bonding region 241 on the other side through the first via hole 2441, and the other one of the first wiring 251 and the second wiring 261 may be connected to the second bonding region 241 on the other side through the second via hole 2451.

To be specific, in the case that the third wiring 270 is the first wiring 251, the fourth wiring 280 is the second wiring 261, the first driving integrated circuitry is the scanning driving integrated circuitry 250, and the second driving integrated circuitry is the data driving integrated circuitry 260, the first wiring 251 may include a first segment connecting the scanning driving integrated circuitry 250 and the second via hole 2451, and a second segment connecting the first segment and the second bonding region 241 through the second via hole 2451. The second wiring 261 may include a third segment 281 connecting the second bonding region 241 and the first via hole 2441, and a fourth segment 282 connecting the third segment 281 and the data driving integrated circuitry 260 through the first via hole 2441, and the first segment and the third segment may be respectively located on two sides of the chip on film 240.

In the case that the third wiring 270 is the second wiring 261, the fourth wiring 280 is the first wiring 251, the first driving integrated circuitry is the data driving integrated circuitry 260, and the second driving integrated circuitry is the scanning driving integrated circuitry 250, the second wiring 261 may include a first segment connecting the data driving integrated circuitry 260 and the second via hole 2451, and a second segment connecting the first segment and the second bonding region 241 through the second via hole 2451. The first wiring 251 may include a third segment 281 connecting the second bonding region 241 and the first via hole 2441, and a fourth segment 282 connecting the third segment 281 and the scanning driving integrated circuitry 250 through the first via hole 2441, and the first segment and the third segment may be respectively located on two sides of the chip on film 240.

Figure 7:
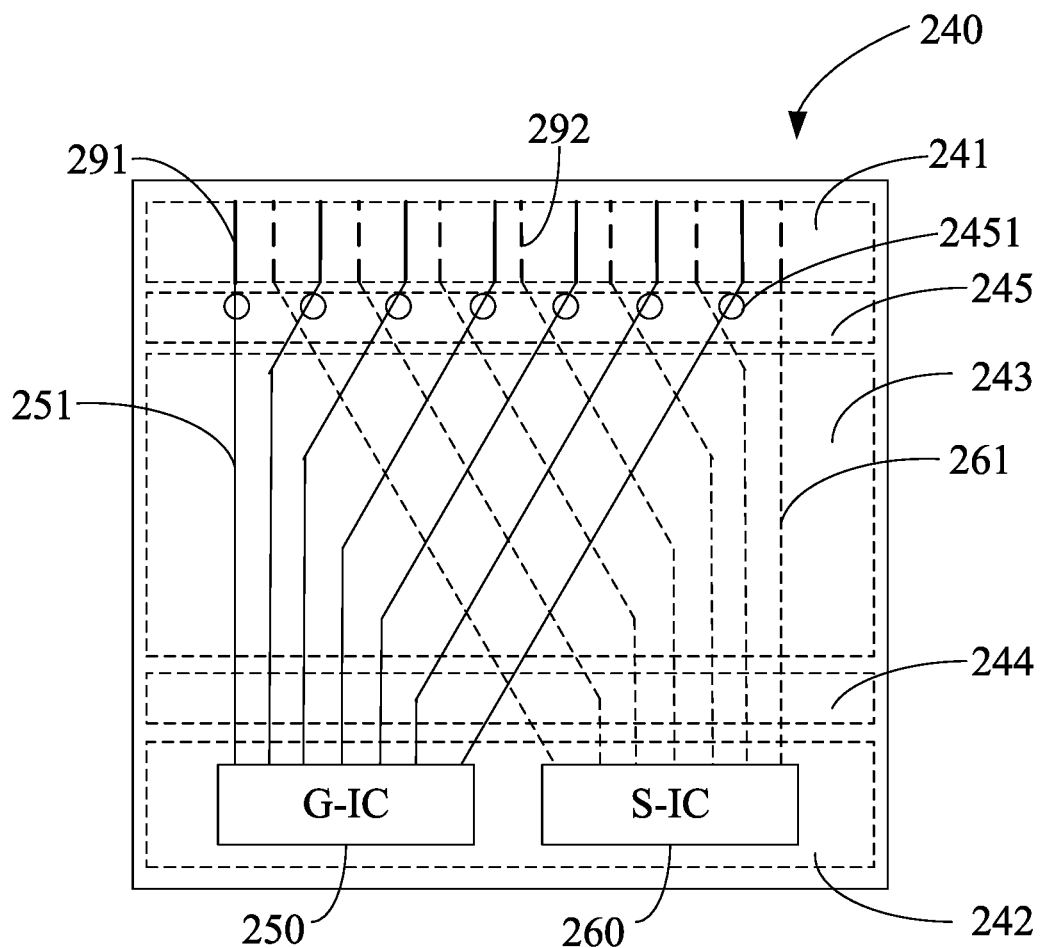
FIG. 7 is still yet another schematic view showing the chip on film in the display panel according to an embodiment of the present disclosure.
Figure 8:
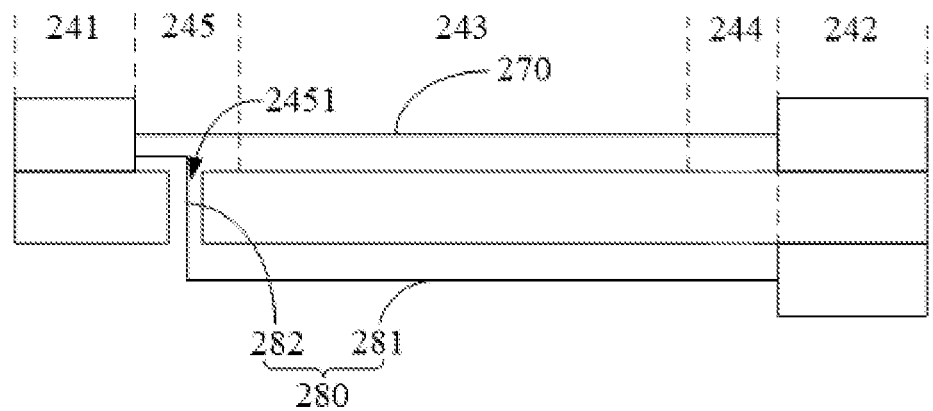
FIG. 8 is a schematic view showing wirings corresponding to FIG. 7.

In yet another possible embodiment of the present disclosure, as shown in FIG. 7 and FIG. 8, the plurality of bonding electrodes and a first driving integrated circuitry may be located on the same side of the chip on film 240, and a second driving integrated circuitry may be located on the other side of the chip on film 240. A third wiring 270 may be located on the same side of the chip on film 240 as the plurality of bonding electrodes and the first driving integrated circuitry. The chip on film 240 may further include a third region 244 located between the first region 242 and the second region 243 and a fourth region 245 located between the second bonding region 241 and the second region 243, and the fourth region 245 may be provided with a third via hole 2451. A fourth wiring 280 may include a first segment 281 connecting the second driving integrated circuitry and the third via hole 2451 and a second segment 282 connecting the first segment 281 and the second bonding region 241 through the third via hole 2451. The third wiring 270 may be the first wiring 251, the fourth wiring 280 may be the second wiring 261, the first driving integrated circuitry may be the scanning driving integrated circuitry 250, and the second driving integrated circuitry may be the data driving integrated circuitry 260; or the third wiring 270 may be the second wiring 261, the fourth wiring 280 may be the first wiring 251, the first driving integrated circuitry may be the data driving integrated circuitry 260, and the second driving integrated circuitry may be the scanning driving integrated circuitry 250.

In the embodiment of the present disclosure, one of the first wiring 251 and the second wiring 261 may be arranged on the same side as the bonding electrodes, and a part of the other one of the first wiring 251 and the second wiring 261 located in the second region 243 may be arranged on a different side from the bonding electrodes.

To be specific, in the case that the third wiring 270 is the first wiring 251, the fourth wiring 280 is the second wiring 261, the first driving integrated circuitry is the scanning driving integrated circuitry 250, and the second driving integrated circuitry is the data driving integrated circuitry 260, the first wiring 251 may be located on the same side of the chip on film as the scanning driving integrated circuitry 250, the second wiring 261 may include a first segment connecting the second bonding region 241 and the third via hole 2451, and a second segment connecting the first segment and the data driving integrated circuitry 260 through the third via hole 2451.

In the case that the third wiring 270 is the second wiring 261, the fourth wiring 280 is the first wiring 251, the first driving integrated circuitry is the data driving integrated circuitry 260, and the second driving integrated circuitry is the scanning driving integrated circuitry 250, the second wiring 261 may be located on the same side of the chip on film as the data driving integrated circuitry 260, the first wiring 251 may include a first segment connecting the second bonding region 241 and the third via hole 2451, and a second segment connecting the first segment and the scanning driving integrated circuitry 250 through the third via hole 2451.

Figure 9:
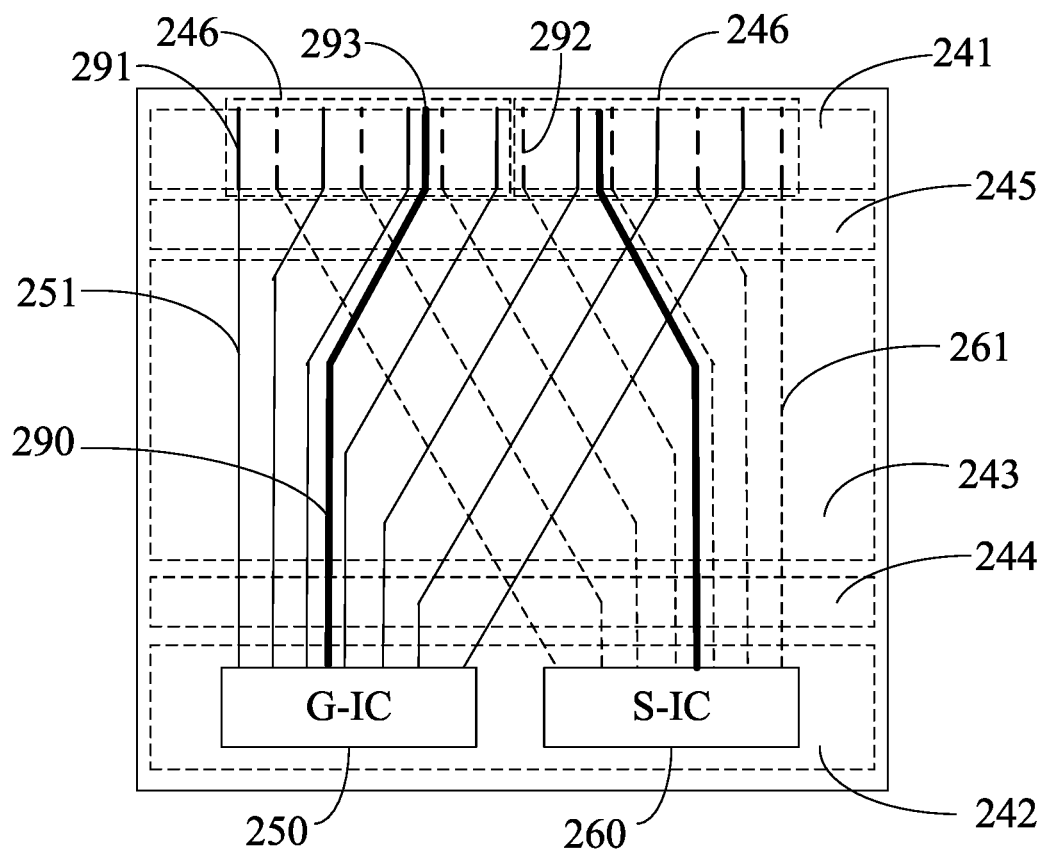
FIG. 9 is still yet another schematic view showing the chip on film in the display panel according to an embodiment of the present disclosure.

Further, as shown in FIG. 9, the second bonding region 241 may include a plurality of repetition units 246. Each repetition unit 246 may include a first low level signal electrode 293, at least one first bonding electrode 291 and at least one second bonding electrode 292.

Each repetition unit 246 may be provided with the first low level signal electrode 293, so as to prevent a scanning signal on the first bonding electrode 291 from being coupled to a data signal on the second bonding electrode 292.

Each repetition unit 246 may include P first bonding electrodes and Q second bonding electrodes, and P and Q are each a positive integer.

As shown in FIG. 9, the chip on film 240 may further include first low level signal lines 290 connected to the first low level signal electrodes 293 respectively. The first low level signal line 290 may be arranged at a same layer as the first wiring 251 in the second region 243, and electrically connected to the scanning driving integrated circuitry 250; or the first low level signal line 290 may be arranged at a same layer as the second wiring 261 in the second region 243, and electrically connected to the data driving integrated circuitry 260.

The first low level signal line 290 may be used to prevent the scanning signal on the first wiring 251 from being coupled to the data signal on the second wiring 261 in the second region 243.

Figure 10:
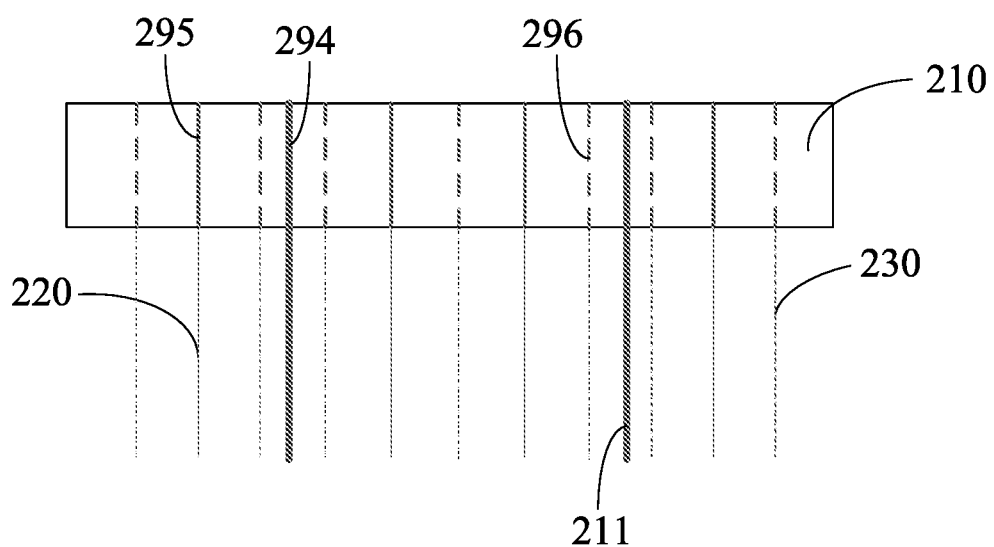
FIG. 10 is a schematic view showing a first bonding region in the display panel according to an embodiment of the present disclosure.

Further, as shown in FIG. 10, the first bonding region 210 may include a plurality of second low level signal electrodes 294, Z signal transmission lines may be arranged between two adjacent second low level signal electrodes 294, and the Z signal transmission lines may include first connection lines 220 and/or second connection lines 230.

In the embodiment of the present disclosure, the second low level signal electrodes 294 in the first bonding region 210 may be bonded to the first low level signal electrodes 293 in the second bonding region 241.

The first bonding region 210 may further include a third bonding electrode 295 and a fourth bonding electrode 296. The third bonding electrode 295 may be bonded to the first bonding electrode 291, and the fourth bonding electrode 296 may be bonded to the second bonding electrode 291.

Through the second low level signal electrode 294, it is able to prevent a scanning signal on the third bonding electrode 295 from be coupled to a data signal on the fourth bonding electrode 296.

The third bonding electrode 295 and the first connection line 220 may be electrically connected to each other after being formed separately, or the third bonding electrode 295 may be a part of the first connection line located in the first bonding region 210, i.e., the third bonding electrode 295 and the first connecting line 220 may be integrally formed. Identically, the fourth bonding electrode 296 and the second connection line 230 may be electrically connected to each other after being formed separately, or the fourth bonding electrode 296 may be a part of the second connection line 230 located in the first bonding region 210, i.e., the fourth bonding electrode 296 and the second connection line 230 may be integrally formed.

In addition, the display panel may further include second low level signal lines 211 connected to the second low level signal electrodes 294 respectively. The second low level signal line 211 may be used to prevent a scanning signal on the first connection line 220 from being coupled to a data signal on the second connection line 230 in the non-display region 120. A first end of the second low level signal line 211 may be electrically connected to the second low level signal electrode 294, and a second end of the second low level signal line 211 may be located at an edge of the non-display region or located at a middle position between the display region and the bonding region 210, which will not be particularly defined herein.

The Z signal transmission lines may include X first connection lines and Y second connection lines, and X and Y are each a positive integer.

Figure 11:
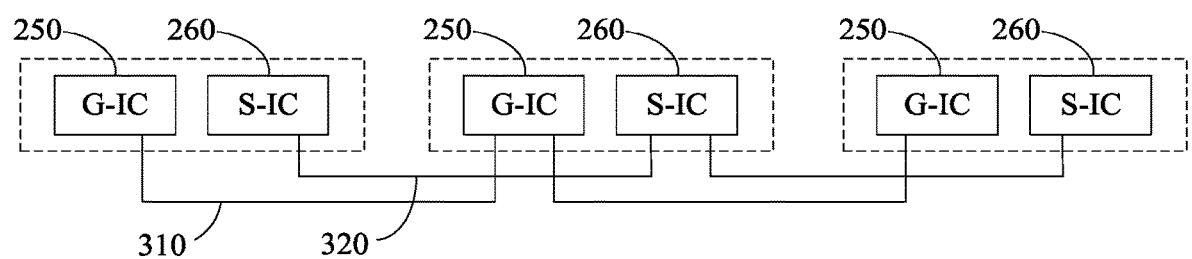
FIG. 11 is a schematic view showing connection between chip on films in the display panel according to an embodiment of the present disclosure.

Further, as shown in FIG. 11, two scanning driving integrated circuitries 250 arranged respectively on two adjacent chip on films 240 may be connected to each other via a scanning input/output signal line 310, and two data driving integrated circuitries 260 arranged respectively on two adjacent chip on films 240 may be connected to each other via a data input/output signal line 320.

In the embodiment of the present disclosure, in the case of a large-size display device, it is difficult for one chip on film 240 to control all the gate lines and the data lines. Hence, a plurality of chip on films 240 may be provided to control different gate lines and data lines.

In the embodiment of the present disclosure, a batch of gate lines connected to each chip on film 240 may be continuously arranged, that is, the batch of gate lines may be connected to consecutive rows of pixel regions. For example, when a resolution of the display device is 1920× 1080, and the quantity of chip on films 240 is 4, the scanning driving integrated circuitry 250 of each chip on film 240 is configured to apply a scanning signal to 270 gate lines in a time division manner.

Identically, a batch of data lines connected to each chip on film 240 may be continuously arranged, that is, the batch of data lines may be connected to consecutive rows of pixel regions. For example, when the resolution of the display device is 1920×1080, and the quantity of chip on films 240 is 4, the data driving integrated circuitry 260 of each chip on film 240 is configured to apply a data signal to 480 data lines in a time division manner.

Two scanning driving integrated circuitries 250 arranged respectively on two adjacent chip on films 240 may be connected to each other via the scanning input/output signal line 310, and two data driving integrated circuitries 260 arranged respectively on two adjacent chip on films 240 may be connected to each other via the data input/output signal line 320.

After the scanning signal has been applied to the corresponding gate lines in a time division manner, the first chip on film may apply a scanning on signal to a second chip on film, and the second chip on film starts to apply a scanning signal to the corresponding gate lines in a time division manner. In this regard, it is able to apply the scanning signal to the gate lines in a time division manner through the plurality of chip on films 240.

During the application of the scanning signal to one gate line, after the data signal has been applied to the corresponding data lines in a time division manner, the first chip on film may apply a data on signal to the second chip on film, and the second chip on film starts to apply the data signal to the corresponding data lines in a time division manner. In this regard, it is able to apply the data signal to the data lines in a time division manner through the plurality of chip on films 240.

The present disclosure further provides in some embodiments a display device including the above-mentioned display panel.

The display device may be a display, a mobile phone, a tablet computer, a television, a wearable electronic device, a navigation display device, etc.

Figure 12:
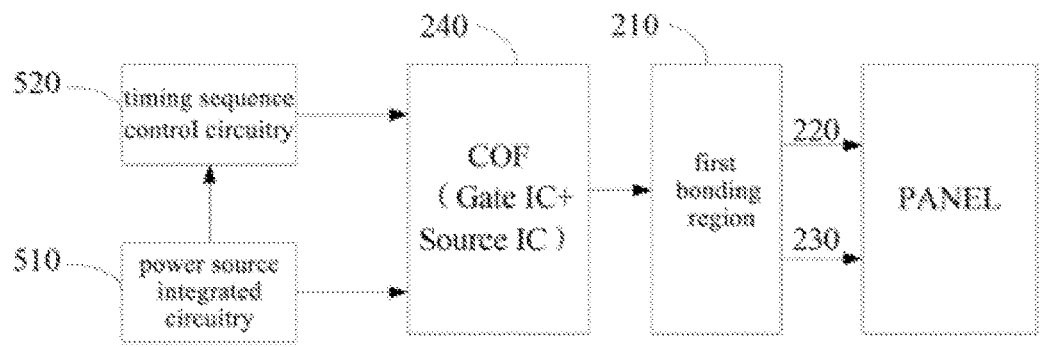
FIG. 12 is a schematic view showing a display device according to an embodiment of the present disclosure.

As shown in FIG. 12, the display device may further include a power management integrated circuitry 510 and a timing sequence control circuitry 520. The power management integrated circuitry 510 is configured to apply an operation voltage to the timing sequence control circuitry 520. The timing sequence control circuitry 520 is configured to apply a timing sequence signal to the chip on film 240. The power management integrated circuitry 510 is further configured to apply a digital voltage signal and an analog voltage signal to the chip on film 240.

In the embodiments of the present disclosure, the timing sequence control circuitry 520 may apply the timing sequence signal to the scanning driving integrated circuitry 250, so that the scanning driving integrated circuitry 250 may function as to apply a scanning signal to a plurality of gate lines in a time division manner like the GOA unit. The timing sequence control circuitry 520 may apply the timing sequence signal to the data driving integrated circuitry 260, so that the data driving integrated circuitry 260 may synchronously apply a corresponding data signal in accordance with a timing sequence of the scanning driving integrated circuitry 250.

The power management integrated circuitry (PMIC) may apply a digital voltage signal and an analog voltage signal to the scanning driving integrated circuitry 250 and the data driving integrated circuitry 260 for normal operation, so that the scanning driving integrated circuitry 250 may apply the scanning signal to the plurality of gate lines in accordance with the timing sequence signal in a time division manner, and the data driving integrated circuitry 260 may apply a corresponding data signal synchronously. In this regard, it is able to ensure the normal display of the display device.

The timing sequence signal may include, but not limited to, a start vertical (STV) signal applied to the scanning driving integrated circuitry 250, a polarity inversion (POL) signal and a data source row latch signal (TP) of a pixel voltage applied to the data driving integrated circuitry 260.

The digital voltage signal may include, but not limited to, a TFT turn-on voltage signal (VGH), a TFT turn-off voltage signal (VGL), and a digital power signal (DVDD) applied to the scanning driving integrated circuitry 250.

The analog voltage signal may include, but not limited to, an analog power signal (AVDD) and a semi-analog voltage signal (HAVDD).

The present disclosure further provides in some embodiments a method for driving the above-mentioned display panel, which includes: applying, by the scanning driving integrated circuitry on the at least one chip on film, a gate scanning signal to each gate line through the corresponding first wiring, the second bonding region, the first bonding region and the corresponding first connection line sequentially in a time division manner; and in the case that the gate scanning signal is applied to one gate line, applying, by the data driving integrated circuitry on the at least one chip on film, a data signal to each data line through the corresponding second wiring, the second bonding region, the first bonding region and the corresponding second connection line sequentially.

In the embodiments of the present disclosure, the scanning driving integrated circuitry and the data driving integrated circuitry may be bonded on the same chip on film and bonded to the first bonding region of the non-display region to replace a gate driver on array (GOA) unit having a relatively large area, so as to provide a display device with a narrow bezel as a whole without affecting the normal scanning of the gate line. As a result, according to the embodiments of the present disclosure, it is able to provide the display device with a narrow bezel as a whole.

As shown in FIG. 1, the non-display region 120 may be located at a periphery of the display region 110, and surround the display region 110.

The first direction may be a row direction of the display panel, and the second direction may be a column direction of the display panel. Of course, the first direction and the second direction may also be any other directions crossing each other, which will not be particularly defined herein.

Each pixel region may be provided with a thin film transistor (TFT) and a pixel electrode, a source electrode of the TFT may be connected to the data line, a drain electrode of the TFT may be connected to the pixel electrode, and a gate electrode may be connected to the gate line.

The non-display region 120 may include at least one first bonding region 210 located on a same side of the display region 110. The non-display region 120 may further include the first connection line 220 for connecting the first bonding region 210 and the corresponding gate line 111 and the second connection line 230 for connecting the first bonding region 210 and the corresponding data line 112. The first connection line 220 and the second connection line 230 may each include a part bonded in the first bonding region 210. In addition, the first connection line 220 may further include a part connected to the corresponding gate line 111 in the display region 110 as an on-screen wiring.

The second bonding region 241 on the chip on film (COF) 240 may be bonded to the first bonding region 210 in the non-display region 120, so as to transmit an electric signal from the chip on film 240 to the display substrate.

The scanning driving integrated circuitry 250 and the data driving integrated circuitry 260 may be bonded in the first region 242 of the chip on film 240. The scanning driving integrated circuitry 250 may be used to generate a scanning signal. The scanning signal may be transmitted to the second bonding region 241 through the first wiring 251, then transmitted to the first bonding region 210, and then transmitted to the gate line through the corresponding first connection line 220, so as to enable the source electrode of the TFT to be electrically connected to the drain electrode of the TFT in the pixel region. The data driving integrated circuitry 260 may be used to generate a data signal. The data signal may be transmitted to the second bonding region 241 through the second wiring 261, then transmitted to the first bonding region 210, and then transmitted to the data line through the corresponding second connection line 230, so as to charge the pixel electrode connected to the drain electrode of the TFT through the source electrode of the TFT, thereby to enable each light-emitting element in the display region 110 to emit light and enable the display device to display an image.

The first wiring 251 and the second wiring 261 may be arranged at different layers in the second region 243, so as to reduce or even eliminate signal crosstalk generated between the scanning signal on the first wiring 251 and the data signal on the second wiring 261, thereby to improve the signal transmission quality. In addition, it is able to further reduce a wiring space of the chip on film, thereby to reduce a size of the chip on film.

The chip on film may be folded to a back surface of the display panel, so the chip on film itself does not occupy a space in the non-display region of the display panel, as long as the chip on film is connected to the first bonding region in the non-display region of the display panel. In addition, because the scanning driving integrated circuitry and the data driving integrated circuitry are arranged on the chip on film simultaneously, the bonding region may be arranged on only one side of the display panel, so as to reduce an area of the non-display region, and enable a width of a widest bezel among four bezels in the display region to be smaller than 1.5 mm, thereby to provide the display device with an ultra-narrow bezel.

Further, in the display pane as shown in FIG. 11, two scanning driving integrated circuitries arranged respectively on two adjacent chip on films may be connected to each other via a scanning input/output signal line, and two data driving integrated circuitries arranged respectively on two adjacent chip on films may be connected to each other via a data input/output signal line. The applying, by the scanning driving integrated circuitry on the at least one chip on film, the gate scanning signal to each gate line through the corresponding first wiring, the second bonding region, the first bonding region and the corresponding first connection line sequentially in a time division manner includes: after a gate scanning signal has been applied by a scanning driving circuitry on a first chip on film to a first gate line through the corresponding first wiring, the second bonding region, the first bonding region and the corresponding first connection line sequentially in a time division manner, transmitting, by the first chip on film, a scanning on signal to a second chip on film through the scanning input/output signal line, the first chip on film and the second chip on film being two adjacent chip on films, the first gate line being a gate line electrically connected to the scanning driving circuitry in the first chip on film; and after the second chip on film has received the scanning on signal, applying, by a scanning driving circuitry in the second chip on film, a gate scanning signal to a second gate line through the corresponding first wiring, the second bonding region, the first bonding region and the corresponding first connection line sequentially in a time division manner, the second gate line being a gate line electrically connected to the scanning driving circuitry in the second chip on film.

In the embodiment of the present disclosure, in the case of a large-size display device, it is difficult for one chip on film 240 to control all the gate lines and the data lines. Hence, a plurality of chip on films 240 may be provided to control different gate lines and data lines.

In the embodiment of the present disclosure, a batch of gate lines connected to each chip on film 240 may be continuously arranged, that is, the batch of gate lines may be connected to consecutive rows of pixel regions. For example, when a resolution of the display device is 1920× 1080, and the quantity of chip on films 240 is 4, the scanning driving integrated circuitry 250 of each chip on film 240 is configured to apply a scanning signal to 270 gate lines in a time division manner.

Two scanning driving integrated circuitries 250 arranged respectively on two adjacent chip on films 240 may be electrically connected to each other via a scanning input/output signal line 310.

After the scanning signal has been applied to the corresponding gate lines in a time division manner, the first chip on film may apply a scanning on signal to a second chip on film, and the second chip on film starts to apply a scanning signal to the corresponding gate lines in a time division manner. In this regard, it is able to apply the scanning signal to the gate lines in a time division manner through the plurality of chip on films 240.

Further, as shown in FIG. 11, the applying, by the data driving integrated circuitry on the at least one chip on film, the data signal to each data line through the corresponding second wiring, the second bonding region, the first bonding region and the corresponding second connection line sequentially includes: after the data signal has been applied by a data driving circuitry on a first chip on film to a first data line through the corresponding second wiring, the second bonding region, the first bonding region and the corresponding second connection line sequentially, transmitting, by the first chip on film, a data on signal to a second chip on film through the data input/output signal line, the first data line being a data line electrically connected to the data driving circuitry in the first chip on film; and after the second chip on film has received the data on signal, applying, by a data driving circuitry in the second chip on film, a data signal to a second data line through the corresponding second wiring, the second bonding region, the first bonding region and the corresponding second connection line sequentially in a time division manner, the second data line being a data line electrically connected to the data driving circuitry in the second chip on film.

In the embodiment of the present disclosure, a batch of data lines connected to each chip on film 240 may be continuously arranged, that is, the batch of data lines may be connected to consecutive rows of pixel regions. For example, when the resolution of the display device is 1920×1080, and the quantity of chip on films 240 is 4, the data driving integrated circuitry 260 of each chip on film 240 is configured to apply a data signal to 480 data lines in a time division manner.

Two data driving integrated circuitries 260 arranged respectively on two adjacent chip on films 240 may be electrically connected to each other via the data input/output signal line 320.

During the application of the scanning signal to one gate line, after the data signal has been applied to the corresponding data lines in a time division manner, the first chip on film may apply a data on signal to the second chip on film, and the second chip on film starts to apply the data signal to the corresponding data lines in a time division manner. In this regard, it is able to apply the data signal to the data lines in a time division manner through the plurality of chip on films 240.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a display substrate including a display region and a non-display region, wherein
   the display region comprises a plurality of gate lines extending in a first direction and a plurality of data lines extending in a second direction, and the plurality of gate lines intersect the plurality of data lines to define a plurality of pixel regions;
   the non-display region comprises at least one first bonding region located on one side of the display region, and further comprises first connection lines connected to the plurality of gate lines respectively and second connection lines connected to the plurality of data lines respectively;
   at least a part of each first connection line and at least a part of each second connection line are used for bonding connection, and the part of each first connection line and the part of each second connection line used for bonding connection are located in the first bonding region;
   the display panel further comprises one chip on film folded to a back surface of the display panel, the chip on film comprises a second bonding region bonded to the first bonding region, and further comprises a first region and a second region located between the second bonding region and the first region;
   a scanning driving integrated circuitry and a data driving integrated circuitry are bonded to the one chip on film and in the first region, the scanning driving integrated circuitry is connected to the second bonding region via first wirings, and the data driving integrated circuitry is connected to the second bonding region via second wirings; and
   the first wirings and the second wirings are arranged at different layers in the second region,
   wherein the second bonding region comprises a plurality of repetition units, and each repetition unit comprises a first low level signal electrode, at least one first bonding electrode and at least one second bonding electrode, the first bonding electrode receives the scanning signal applied by the scanning driving integrated circuitry through the first wiring, and transmit the scanning signal to the first bonding region, the second bonding electrode receives the data signal applied by the data driving integrated circuitry through the second wiring and transmit the data signal to the first bonding region, the first low level signal electrode is located between the first bonding electrode and the second bonding electrode;

wherein the one chip on film further comprises first low level signal lines connected to the first low level signal electrodes respectively, wherein the first low level signal line is arranged at a same layer as the first wiring in the second region and electrically connected to the scanning driving integrated circuitry.

2. The display panel according to claim 1, wherein a plurality of bonding electrodes is arranged in the second bonding region and comprises first bonding electrodes and second bonding electrodes, the first bonding electrodes are connected to the first wirings respectively, the second bonding electrodes are connected to the second wirings respectively, and the first bonding electrodes and the second bonding electrodes are located on a same side of the chip on film.

3. The display panel according to claim 2, wherein the plurality of bonding electrodes are located on the same side of the chip on film as the scanning driving integrated circuitry and the data driving integrated circuitry;
a third wiring is located on the same side of the chip on film as the scanning driving integrated circuitry and the data driving integrated circuitry;
the chip on film further comprises a third region located between the first region and the second region and a fourth region located between the second bonding region and the second region, the third region is provided with a first via hole, and the fourth region is provided with a second via hole;
a fourth wiring comprises a first segment connected to the second bonding region, a second segment connected to a target driving integrated circuitry and a third segment connected to the second segment through the first via hole and connected to the first segment through the second via hole, and the second segment and the first segment are located on the same side of the chip on film as the third wiring; and
the third wiring is the first wiring, the fourth wiring is the second wiring, and the target driving integrated circuitry is the data driving integrated circuitry; or the third wiring is the second wiring, the fourth wiring is the first wiring, and the target driving integrated circuitry is the scanning driving integrated circuitry.

4. The display panel according to claim 2, wherein the scanning driving integrated circuitry and the data driving integrated circuitry are located on a same side of the chip on film, and the plurality of bonding electrodes is located on the other side of the chip on film;
the chip on film further comprises a third region located between the first region and the second region and a fourth region located between the second bonding region and the second region, the third region is provided with a first via hole, and the fourth region is provided with a second via hole;
a third wiring comprises a first segment connecting a first driving integrated circuitry and the second via hole, and a second segment connecting the first segment and the second bonding region through the second via hole;
a fourth wiring comprises a third segment connecting the second bonding region and the first via hole and a fourth segment connecting the third segment and a second driving integrated circuitry through the first via hole, and the first segment and the third segment are arranged at different layers; and
the third wiring is the first wiring, the fourth wiring is the second wiring, the first driving integrated circuitry is the scanning driving integrated circuitry, and the second driving integrated circuitry is the data driving integrated circuitry; or the third wiring is the second wiring, the fourth wiring is the first wiring, the first driving integrated circuitry is the data driving integrated circuitry, and the second driving integrated circuitry is the scanning driving integrated circuitry.

5. The display panel according to claim 2, wherein the plurality of bonding electrodes and a first driving integrated circuitry are located on the same side of the chip on film, and a second driving integrated circuitry is located on the other side of the chip on film;
a third wiring is located on the same side of the chip on film as the plurality of bonding electrodes and the first driving integrated circuitry;
the chip on film further comprises a third region located between the first region and the second region and a fourth region located between the second bonding region and the second region, and the fourth region is provided with a third via hole;
a fourth wiring comprises a first segment connecting the second driving integrated circuitry and the third via hole and a second segment connecting the first segment and the second bonding region through the third via hole; and
the third wiring is the first wiring, the fourth wiring is the second wiring, the first driving integrated circuitry is the scanning driving integrated circuitry, and the second driving integrated circuitry is the data driving integrated circuitry; or the third wiring is the second wiring, the fourth wiring is the first wiring, the first driving integrated circuitry is the data driving integrated circuitry, and the second driving integrated circuitry is the scanning driving integrated circuitry.

6. The display panel according to claim 1, wherein each repetition unit comprises P first bonding electrodes and Q second bonding electrodes, and P and Q are each a positive integer.

7. The display panel according to claim 1, wherein the first bonding region comprises a plurality of second low level signal electrodes, Z signal transmission lines are arranged between two adjacent second low level signal electrodes, and the Z signal transmission lines comprise the first connection lines and/or the second connection lines.

8. The display panel according to claim 7, wherein the Z signal transmission lines comprise X first connection lines and Y second connection lines, and X and Y are each a positive integer.

9. The display panel according to claim 1, wherein two scanning driving integrated circuitries respectively arranged on two adjacent chip on films are connected to each other via a scanning input/output signal line, and two data driving integrated circuitries respectively arranged on two adjacent chip on films are connected to each other via a data input/output signal line.

10. A display device, comprising the display panel according to claim 1.

11. The display device according to claim 10, further comprising a power management integrated circuitry and a timing sequence control circuitry, wherein the power management integrated circuitry is configured to apply an operation voltage to the timing sequence control circuitry, the timing sequence control circuitry is configured to apply a timing sequence signal to the chip on film, and the power management integrated circuitry is further configured to apply a digital voltage signal and an analog voltage signal to the chip on film.

12. A method for driving the display panel according to claim 1, comprising:
  applying, by the scanning driving integrated circuitry on the one chip on film, a gate scanning signal to each gate line through the corresponding first wiring, the second bonding region, the first bonding region and the corresponding first connection line sequentially in a time division manner; and
  in the case that the gate scanning signal is applied to one gate line, applying, by the data driving integrated circuitry on the one chip on film, a data signal to each data line through the corresponding second wiring, the second bonding region, the first bonding region and the corresponding second connection line sequentially.

13. The method according to claim 12, wherein two scanning driving integrated circuitries respectively arranged on two adjacent chip on films are connected to each other via a scanning input/output signal line, and two data driving integrated circuitries respectively arranged on two adjacent chip on films are connected to each other via a data input/output signal line,
  wherein the applying, by the scanning driving integrated circuitry on the one chip on film, the gate scanning signal to each gate line through the corresponding first wiring, the second bonding region, the first bonding region and the corresponding first connection line sequentially in a time division manner comprises:
  after a gate scanning signal has been applied by a scanning driving circuitry on a first chip on film to a first gate line through the corresponding first wiring, the second bonding region, the first bonding region and the corresponding first connection line sequentially in a time division manner, transmitting, by the first chip on film, a scanning on signal to a second chip on film through the scanning input/output signal line, the first chip on film and the second chip on film being two adjacent chip on films, the first gate line being a gate line electrically connected to the scanning driving circuitry in the first chip on film; and
  after the second chip on film has received the scanning on signal, applying, by a scanning driving circuitry in the second chip on film, a gate scanning signal to a second gate line through the corresponding first wiring, the second bonding region, the first bonding region and the corresponding first connection line sequentially in a time division manner, the second gate line being a gate line electrically connected to the scanning driving circuitry in the second chip on film.

14. The method according to claim 12, wherein the applying, by the data driving integrated circuitry on the one chip on film, the data signal to each data line through the corresponding second wiring, the second bonding region, the first bonding region and the corresponding second connection line sequentially comprises:
  after the data signal has been applied by a data driving circuitry on a first chip on film to a first data line through the corresponding second wiring, the second bonding region, the first bonding region and the corresponding second connection line sequentially, transmitting, by the first chip on film, a data on signal to a second chip on film through the data input/output signal line, the first data line being a data line electrically connected to the data driving circuitry in the first chip on film; and
  after the second chip on film has received the data on signal, applying, by a data driving circuitry in the second chip on film, a data signal to a second data line through the corresponding second wiring, the second bonding region, the first bonding region and the corresponding second connection line sequentially in a time division manner, the second data line being a data line electrically connected to the data driving circuitry in the second chip on film.

\* \* \* \* \*